United States Patent
Celik et al.

(10) Patent No.: US 11,953,543 B2
(45) Date of Patent: Apr. 9, 2024

(54) MEASUREMENT DEVICE, METHOD OF OPERATING THE MEASUREMENT DEVICE AND NON-TRANSITORY COMPUTER-READABLE RECORDING MEDIUM

(71) Applicant: Rohde & Schwarz GmbH & Co. KG, Munich (DE)

(72) Inventors: Mert Celik, Munich (DE); Adam Tankielun, Ottobrunn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 98 days.

(21) Appl. No.: 17/858,153

(22) Filed: Jul. 6, 2022

(65) Prior Publication Data
US 2024/0012044 A1  Jan. 11, 2024

(51) Int. Cl.
*G01R 31/28* (2006.01)

(52) U.S. Cl.
CPC ................. *G01R 31/2822* (2013.01)

(58) Field of Classification Search
CPC .................................................. G01R 31/2822
See application file for complete search history.

(56) References Cited

U.S. PATENT DOCUMENTS

| | | | |
|---|---|---|---|
| 6,636,816 B1* | 10/2003 | Dvorak | H04B 17/21 331/25 |
| 7,554,335 B2* | 6/2009 | Han | G01R 31/2822 324/537 |
| 2008/0022162 A1* | 1/2008 | Qiu | H04B 17/336 714/704 |
| 2011/0188561 A1* | 8/2011 | Mizrahi | H04B 1/1027 375/227 |
| 2016/0195606 A1* | 7/2016 | Sugino | G01S 7/023 342/195 |
| 2019/0273564 A1* | 9/2019 | Vella-Coleiro | G01R 23/20 |

FOREIGN PATENT DOCUMENTS

CN 107919924 A 4/2018

* cited by examiner

*Primary Examiner* — Akm Zakaria
(74) *Attorney, Agent, or Firm* — Westman, Champlin & Koehler, P.A.

(57) ABSTRACT

A measurement device and method for testing a device under test (DUT). The device includes an input terminal for receiving a RF signal from the DUT; at least one analog-to-digital (A/D) converter configured to generate a digital data including a plurality of sampled signals from the received RF signal; at least one filter configured to filter the digital data generated by the at least one A/D converter based on an intermediate-frequency bandwidth (IFBW) set in the at least one filter; a detector configured to analyse the filtered digital data based on a pre-set number of samples from the filtered digital data; and a controller configured to calculate a signal-to-noise ratio (SNR) value of the analysed filtered digital data, and to adjust at least one of the IFBW of the at least one filter and the number of samples of the detector based on the calculated SNR value.

23 Claims, 4 Drawing Sheets

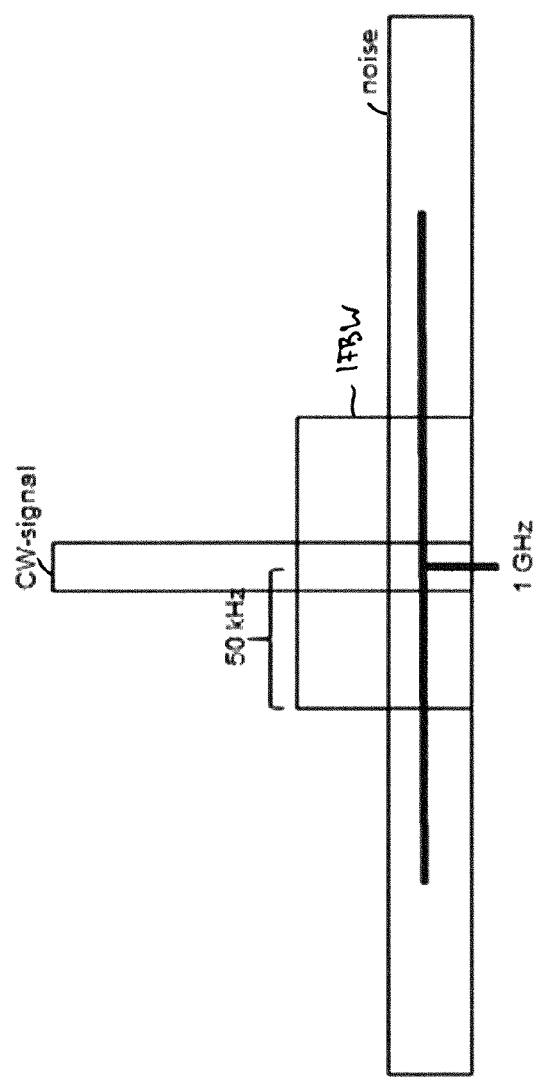

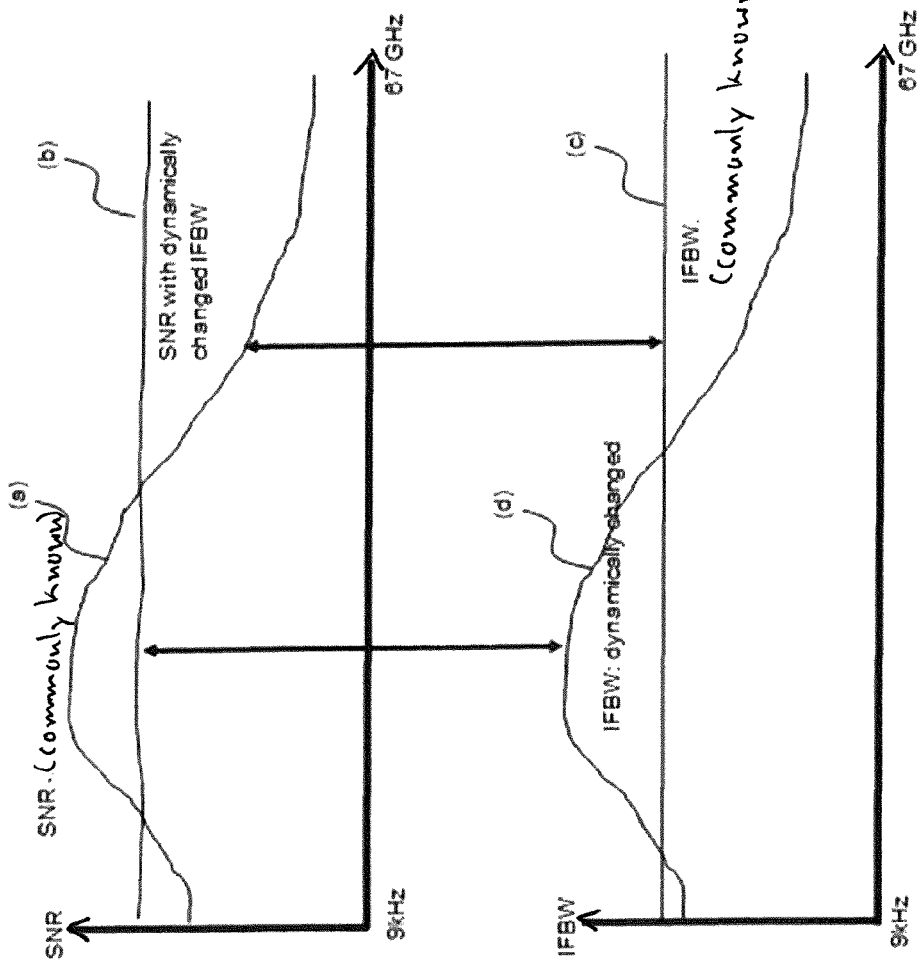

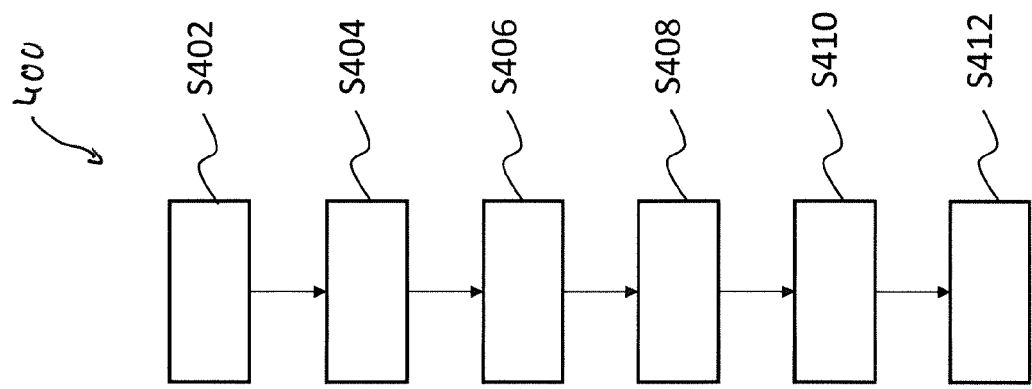

MEASUREMENT DEVICE, METHOD OF OPERATING THE MEASUREMENT DEVICE AND NON-TRANSITORY COMPUTER-READABLE RECORDING MEDIUM

FIELD OF THE INVENTION

The present invention relates to a measurement device for testing a device under test. The invention further relates to a method of operating the measurement device and a non-transitory computer-readable recording medium.

TECHNICAL BACKGROUND

Nowadays, measurement devices (like network analyzers or spectrum analyzers) have a plurality of settings. It takes much experience to evaluate whether the achieved measurement data are of a good quality or not.

However, the users of those measurement devices are not always in-depth in RF measurement theory behind vector network analyzer (VNA). For example, not every engineer is familiar with the problems related to relatively low directivity of the VNA in low-frequency region. That sometimes makes configuring a VNA challenging for demanding measurements. As an example, a UOSM (Unknown Through, Open, Short, Match) calibration using a common VNA may not be stable for certain circumstances, which is mainly due to non-linearities introduced at lower frequencies. On the other hand, customers do not have any metric showing how good the measurement results are. Currently, VNAs are used in general with constant power and constant intermediate frequency bandwidth (IFBW). It is believed that these two parameter do not give direct insight how accurate the measurements are conducted.

Therefore, it is desired to develop an easier way to provide the user with more instinctive data representing how reliable the measured data is. In addition, it is also preferred to maintain the quality of measured date above a certain level efficiently.

SUMMARY OF THE INVENTION

Against this background, there is the need to provide a measurement for testing a device under test with feedbacks to a user regarding the reliability of the measurement result.

Accordingly, the present disclosure provides a measurement device for testing a device under test, a method of operating the measurement device and a non-transitory computer-readable recording medium having the features of the independent claims.

According to a first aspect of the present disclosure, a measurement device for testing a device under test (DUT) is provided. The measurement device comprises: an input terminal for receiving a RF signal from the DUT; at least one analog-to-digital (A/D) converter configured to generate a digital data signal including a plurality of samples of the received RF signal; at least one filter configured to filter the digital data signal generated by the at least one A/D converter based on an intermediate-frequency bandwidth (IFBW) set in the at least one filter; a detector configured to analyse the filtered digital data signal based on a pre-set number of samples from the filtered digital data signal; and a controller configured to calculate a signal-to-noise ratio (SNR) value of the analysed filtered digital data signal, and further configured to adjust at least one of: a) the IFBW of the at least one filter and b) the number of samples of the detector based on the calculated SNR value.

According to a second aspect of the present disclosure, a method of operating a measurement device for testing a device under test (DUT) is provided. The method comprises: receiving, by an input terminal, a RF signal from the DUT; generating, by at least one analog-to-digital (A/D) converter, a digital data signal including a plurality of samples of the received RF signal; filtering, by at least one filter, the digital data signal generated by the at least one A/D converter based on an intermediate-frequency bandwidth (IFBW) set in the at least one filter; analysing, by a detector, the filtered digital data signal based on a pre-set number of samples from the filtered digital data signal; calculating, by a controller, a signal-to-noise ratio (SNR) value of the analysed filtered digital data signal; and adjusting, by the controller, at least one of: a) the IFBW of the at least one filter and b) the number of samples of the detector based on the calculated SNR value.

According to a third aspect of the present disclosure, a non-transitory computer-readable recording medium storing instructions executable by a computer processor, causing the computer processor to execute a method of operating a measurement device for testing device under test is provided. The instruction comprises: receiving, by an input terminal, a RF signal from the DUT; generating, by at least one analog-to-digital (A/D) converter, a digital data signal including a plurality of samples of the received RF signal; filtering, by at least one filter, the digital data signal generated by the at least one A/D converter based on an intermediate-frequency bandwidth (IFBW) set in the at least one filter; analysing, by a detector, the filtered digital data signal based on a pre-set number of samples from the filtered digital data signal; calculating, by a controller, a signal-to-noise ratio (SNR) value of the analysed filtered digital data signal; and adjusting, by the controller, at least one of: a) the IFBW of the at least one filter and b) the number of samples of the detector based on the calculated SNR value.

The present invention provides a metric to a user who uses the measurement device whether the measured signal is of a good quality or not.

The present invention is based on the knowledge that users are typically familiar with the SNR (signal-to-noise ratio). As such, it was found out that a user can better qualify the measurement result if the measured signal comprises a specific SNR value. In that case, the present invention suggests that measurement properties of the measurement devices are set in such a way that a specific SNR is achieved over the whole measurement.

So-called noise figure measurement options of measurement devices (for example, VNAs) employ a digital signal processing algorithm which comprises checking the ratio between standard deviation and mean of a single measurement point using different detectors/filters. According to the present invention this algorithm is extended as follows: instead of asking customers to enter an IFBW, it is possible to instruct users to enter a minimum desired SNR of a measurement for a given frequency range. During each sweep, the VNA would reduce the IFBW in real time until the user-specific (user-desired) SNR is reached for each and every measurement point, by using the algorithm described/already used by the noise figure measurement option. The users can use this measurement method for all their measurements. In case this increase sweep time, mainly for scenarios where measurement setup or DUT parameters do not change much, the user can obtain a "recommended" IFBW with respect to frequency, calculated by the constant-SNR option/method.

In addition to these advantages, sweep times can even be decreased by optimally using the highest IFBW for a given measurement setup for a given minimum-SNR. This can be very helpful in production testing. It is believed that using SNR as a "relative-accuracy-metric" is advantageous, mainly because it is easy to understand even by engineers which are not non-RF experts.

The measurement device may analyse signals over a certain frequency span. The measurement device may sweep through that frequency span. This is done by using e.g. hundreds, thousands, millions, etc. of frequency steps, where each step is spaced apart from the previous step by a certain, specific or predefined frequency.

The measurement device is configured to calculate the SNR for each frequency step. If the SNR does not match a predefined criterion, then the measurement properties are changed so that the SNR now matches those criteria. After that, the measured result is stored and/or (later) presented to the user.

A first factor for changing the measurement properties for obtaining a desired SNR value lies in the IFBW (intermediate frequency bandwidth) property of a digital filter which may be arranged downstream of an A/D-converter. If the IFBW is increased (i.e. the bandwidth becomes wider) then the SNR is reduced. If the IFBW is reduced (i.e. the bandwidth becomes smaller) then the SNR is improved. However, some measurement devices do not allow that the IFBW is reduced below a certain bandwidth.

In order to further improve the SNR, a second factor for changing the measurement properties for obtaining the desired SNR value lies in amending the number of samples an average detector averages. For example, the SNR is calculated by using the detection results from two detectors: A first detector is a RMS detector; and a second detector is an average detector. Both detectors receive a digital data stream output from the digital filter which IFBW properties could also have been already changed.

If more samples are averaged, the SNR improves. If fewer samples are averaged the SNR is reduced.

When the IFBW is increased, a faster measurement is possible whereas SNR is degraded. When the IFBW is reduced, SNR is improved whereas the speed of measurement is reduced. When more samples are averaged, the SNR can be improved whereas the measurement speed can be degraded. When fewer samples are averaged, measurement speed is increased whereas the SNR is reduced.

In case the measurement time increases due to the calculated SNR does still not match the predefined criteria, then the above mentioned changes are made. During those changes more and more samples of the signal are captured. Then the SNR is calculated again for the same frequency step.

According to the present disclosure, the IFBW and the amount of samples the average detector uses can be changed within a single sweep of the measurement device.

If a frequency step is for example at 1 GHz, the measurement devices adjusts those measurement properties in order to obtain a desired SNR. Until done, the measurement device proceeds with the next measurement step (for example 100 kHz above 1 GHz) and does the same adjusting process.

The spacing between two frequency steps is preferably maintained the same even if the IFBW is reduced.

The desired SNR can be entered by a user, for example by entering a specific SNR value. In that case, the measurement device will try that the SNR is reached for each frequency step during the sweep.

Additionally or alternatively, a desired SNR range can be entered by a user. In that case, the measurement device will try that the SNR lies within that range for each frequency step during the sweep.

It would also be desirable if the SNR is plotted over the frequency span. The SNR can be plotted into the same graph as the actual measurement result or alternatively in a separate graph, wherein both graphs are preferably displayed at the same time.

Advantageous configurations and developments emerge from the further dependent claims and from the description with reference to the figures of the drawings.

According to a further aspect, the controller may be configured to control at least one of the IFBW and the number of samples in accordance with the calculated SNR such to meet a predetermined measurement criterion.

According to a further aspect, the predetermined measurement criterion may be defined by one of: a specific SNR value, a plurality of specific SNR values and a specific SNR range.

According to a further aspect, the controller is configured to reduce the IFBW and/or to increase the number of samples, in case the calculated SNR value is below the predetermined SNR range or below the predetermined SNR value.

According to a further aspect, the controller is configured to increase the IFBW and/or to decrease the number of samples, in case the calculated SNR value is above the predetermined SNR range or above the predetermined SNR value.

According to a further aspect, the controller may be configured to adjust the IFBW to be reduced when the calculated SNR value does not meet the predetermined measurement criterion.

According to a further aspect, the controller may be configured to adjust the number of samples to be increased when the calculated SNR value does not meet the predetermined measurement criterion.

According to a further aspect, the controller may be configured to control at least one of the IFBW and the number of samples in accordance with the calculated SNR such to adjust a measurement speed.

According to a further aspect, the measurement device may further comprise: a user interface configured to display the calculated SNR value to a user.

According to a further aspect, the user interface may be configured to display the calculated SNR value together with the result of the analysis at the same time.

According to a further aspect, the user interface may be configured to receive a user-specific measurement criterion, such as a specific or predetermined SNR value, from a user.

According to a further aspect, the user interface may be configured to receive a user request from the user to maintain the SNR value that meets the predetermined measurement criterion to be constant.

According to a further aspect, the filter may be configured to sweep at least one of a plurality of frequency steps, and the controller is configured to calculate the SNR value for each of the plurality of frequency steps.

According to a further aspect, the plurality of frequency steps may be spaced apart from each other, and wherein the controller is configured to adjust each spacing between adjacent frequency steps.

According to a further aspect, the spacing between adjacent frequency steps may be set by a user via a user interface.

According to a further aspect, the measurement device may further comprise an analog mixer arranged between the input terminal and the at least one A/D converter, wherein a local oscillator signal is fed to the analog mixer.

According to a further aspect, the controller is configured to subsequently change or adjust the frequency of the local oscillator signal during a sweep in the form of a frequency sweep.

According to a further aspect, the controller may be configured to change or adjust at least one of the IFBW and the number of samples repeatedly until either the calculated SNR meets a measurement criterion or a predefined timer is expired.

According to a further aspect, the detector includes at least one of: a root mean square (RMS) detector and an average detector. The controller is further configured to calculate the SNR based on the result provided by the RMS detector and by the average detector, respectively.

According to a further aspect, the measurement criterion may be determined based on at least one of: a signal level of the RF signal and a rotary angle of an antenna of the measurement device.

According to a further aspect, the measurement device further comprises a signal generator and an output terminal. The signal generator is configured to generate an excitation signal which is provided via the output terminal to a DUT.

According to a further aspect, the measurement device comprises at least one of:
a vector network analyzer (VNA),
a spectrum analyzer,
a signal analyzer,
a communication analyzer.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENT OF THE DRAWINGS

The present invention is described in greater detail in the following on the basis of the embodiments shown in the schematic figures of the drawings, in which:

FIG. 3 is an example of a continuous-wave (CW) signal, IFBW and noise distribution for a specific frequency step according to an aspect;

FIG. 3A is an example of operational scheme of a measurement device according to according to an aspect;

FIG. 3B is an example of operational scheme of a measurement device according to according to an aspect;

FIG. 4 is a flow chart illustrating a method of operating a measurement device for testing a device under test according to an aspect.

Figure 1:
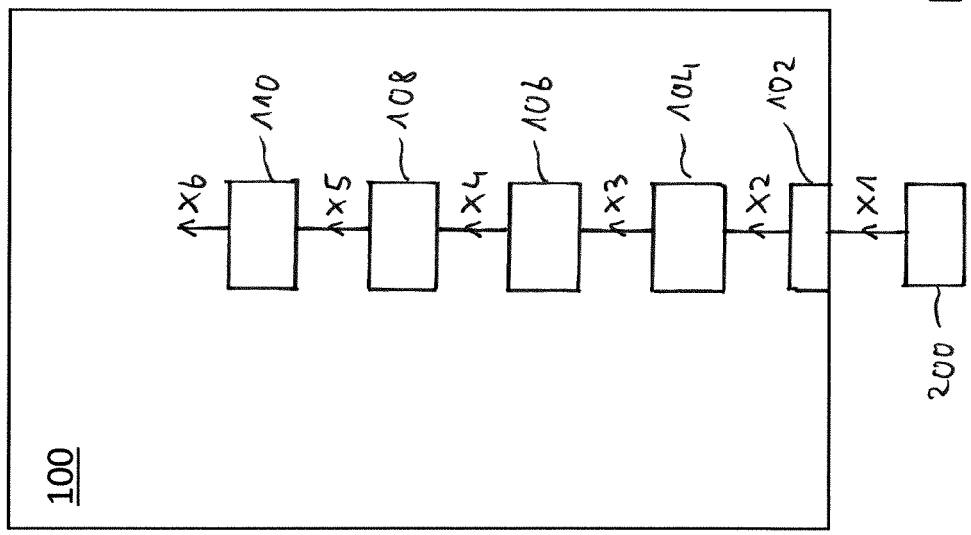
FIG. 1 shows a block diagram illustrating a measurement device for testing a device under test (DUT) according to an aspect of the present disclosure.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

FIG. 1 shows a block diagram illustrating a measurement device for testing a device under test (DUT) according to an aspect of the present disclosure;

In FIG. 1, the measurement device is denoted by reference symbol 100. The measurement device 100 comprises input terminal 102, an analog-to-digital (A/D) converter 104, a filter 106, a detector 108 and a controller 110.

For measurement purposes, a DUT 200 is coupled or connected to the input terminal 102 which is used to receive a RF signal X1 from the DUT 200.

The analog-to-digital (A/D) converter 104 which is connected downstream the input terminal 102 is configured to receive the received RF signal X2 from the input terminal 102 and to generate a digital data signal X3 thereof. The digital data signal X3 includes a plurality of sampled signals from the received RF signal X2.

The filter 106 which is connected downstream the A/D converter 104 is configured to filter the digital data signal X3 generated by the A/D converter 104 based on an intermediate-frequency bandwidth (IFBW) set in the at least one digital filter and to generate a filtered digital data signal X4.

The detector 108 which is connected downstream the filter 106 is configured to analyse the filtered digital data signal X4 based on a pre-set number of samples from the filtered digital data signal and to generate an analysed filtered digital data signal X5 thereof.

The controller 110 which is connected downstream the detector 108 is configured to calculate a signal-to-noise ratio (SNR) value X6 of the analysed filtered digital data signal X5. Further, the controller 110 is configured to adjust the IFBW of the digital filter 106 and/or the number of samples of the detector 108 based on the calculated SNR value X6.

Figure 2:
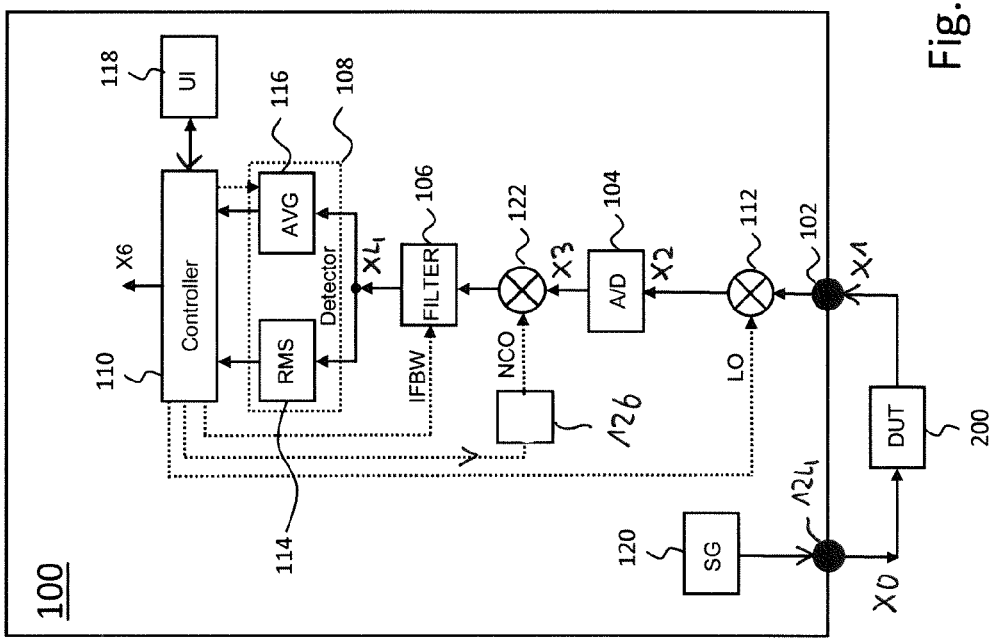
FIG. 2 shows a schematic diagram of a measurement device for testing a DUT according to a further aspect of the present disclosure.

FIG. 2 shows a more detailed schematic diagram of a measurement device 100 for testing a device under test (DUT) according to a further aspect.

The measurement device 100 may be a vector network analyzer (VNA), a spectrum analyzer, a signal analyzer, a communication analyzer or any other frequency analyzing device.

Similar to the example shown in FIG. 1, the measurement device 100 illustrated in FIG. 2 includes also an input terminal 102, an analog-to-digital (A/D) converter 104, a filter 106, a detector 108, and a controller 110.

In the example in FIG. 2, the measurement device 100 may further include a first mixer 112, a user interface 118, a signal generator 120, a second mixer 122, an output terminal 124 and an oscillator 126.

The mixer 112 is preferably an analog mixer 112 and the mixer 122 is a digital mixer 122.

The measurement device 110 may further include a second mixer 122 which is arranged between the A/D converter 104 and the filter 106.

The oscillator 126 may preferably be a numerically controlled oscillator (NCO) 126. The frequency signal of the NCO 126 is fed to the second mixer 122.

Furthermore, the detector 108 may include at least one root mean square (RMS) detector 114 and/or an average detector 116.

For test purposes, a signal X0 generated by the signal generator 120 is provided via the output terminal 124 to the DUT 200. The DUT generates a corresponding RF test signal X1 thereof which is forwarded via the input terminal 102 back to the measurement device 100. The measurement device 100 may be configured to analyse the received signal X1 from the DUT 200.

The DUT 200 is not limited to a specific device or instrument. For example, the DUT 200 may also be a part of a device, e.g. such as an antenna connected to or coupled to the measurement device 100. The DUT 200 may be connected to the input terminal 102 wirelessly or via wire, e.g. by directly connecting an output port of the DUT 200 to the input terminal 102. In case of a wireless coupling of the DUT 200 and the measurement circuit 100, the input terminal comprises a receiver interface (not shown in FIG. 2) for receiving the wirelessly transmitted digital RF signal X1.

The A/D converter 104 is configured to generate a digital data signal X3 from the received RF signal X2 that is received via the input terminal 102. In the embodiment of FIG. 2, the digital data signal X3 may be a digital data stream. The digital data signal X3 includes a plurality of samples of the digital signal. More specifically, the A/D converter 104 is configured to capture the received RF signal X2, and to generate digitized data.

The filter 106 is configured to filter the digital data signal X3 generated by the A/D converter 104 based on an intermediate bandwidth (IFBW) which is set in the filter 106. The filter 106 is preferably a digital filter.

The IFBW is one of the parameter for the filter 106 to be operated. The IFBW may lie between the low frequency (low frequency (0.1 Hz to 1 kHz)) and the radiofrequency (radio frequency (10 MHz to 300 GHz)).

The configuration of the IFBW may determine the SNR value of the RF signal X1 that is to be measured by the measurement device 100.

The filter 106 is arranged downstream the A/D converter 104 such that the filter 106 receives the digital data signal X3 from the A/D converter 104.

The filter 106 is configured to sweep at least one of a plurality of frequency steps. As will be described yet below, the controller 110 is configured to calculate the SNR value for each of the plurality of frequency steps. Furthermore, the filter 106 may sweep not only on frequency, but also on power and time.

The plurality of frequency steps may be spaced apart from each other, and the controller 110 is configured to adjust each spacing between adjacent frequency steps. The spacing between adjacent frequency steps may be user-specific changed or adjusted by a user via a user interface 118. The filter 106 may be configured with a default spacing between adjacent frequency steps. The user interface 118 may be a suitable key-board that is integrated in the measurement device 100 or separate to the measurement device 100. However, the user interface 118 may also be implemented in the display of the measurement device 100 (not shown in FIG. 2), which is for example implemented as a touch screen with an input interface. Alternatively, the user interface 118 may also be a web-based interface so that a user can control the measurement device 100 via an internet link. In this case, the control comprises a wired or wireless web-interface (not shown in FIG. 2). The detector 108 is arranged downstream the filter 106. The detector 108 is configured to analyse the filtered digital data signal X4 based on a pre-set number of samples from the filtered digital data signal X4. In this description, the data or signals analysed by the detector 108 may be an object to be measured by the measurement device 100. The detector 108 may analyse the RF signal X1 received from the DUT 200, and to generate an analysis result. The analysis may be a S-parameter measurement. Therefore, the result of the analysis may include the result of the S-parameter measurement.

The detector 108 may be configured to analyse the RF signal X1 by averaging the pre-set number of samples from the filtered digital data signal X4.

The pre-set number of samples can be adjusted by the controller 110, as will be described yet below. Depending on the number of samples, the SNR value of the measured data can be varied. The pre-set number of samples can be adjusted by controlling the detection time of the detector 108.

In the example of FIG. 1, the detector 108 includes a root mean square (RMS) detector 114 and an average detector 116. The RMS detector 114 provides an average signal power of a signal as opposed to a peak of the signal. Root mean square (RMS), defined as the square root of the mean square of the input signal over time, is a useful metric for alternating signals. The average detector 116 provides an average amplitude of the signal across a specific period.

By employing both, the RMS detector 114 and the average detector 116, the detector 108 may take advantage of both of them to draw the result of analysis. Alternatively, the detector 108 may also use only one of the RMS detector 114 and the average detector 116 to analyse the received signal X1.

The controller 110 is then configured to calculate a SNR value X6 of the analysed filtered digital data signal X5. That is, the controller 110 is configured to calculate the SNR value of the measured signal.

The controller 110 may be configured to continuously calculate the SNR value. The controller 110 is configured to adjust the IFBW of the filter 106 and/or the number of samples of the detector 108 (RMS detector 114 and/or average detector 116) based on the calculated SNR value.

The controller 110 is configured to calculate the SNR value for each of the plurality of frequency steps. The plurality of frequency steps may be spaced apart from each other, and the controller 110 is configured to adjust each spacing between adjacent frequency steps. The purpose of adjusting the IFBW and/or the number of samples for the controller 110 is to control the SNR value to meet a predefined measurement criterion.

The predefined measurement criterion may be defined based on a specific SNR or a specific SNR range. In case that the predefined measurement criterion is set as a SNR range, the controller 110 may adjust the IFBW and/or the number of samples to keep the SNR to within the SNR range. In this manner, the controller 110 may balance between the SNR value and the measurement speed, because the reduction of IFBW or increase of number of samples results in an improvement of the SNR and at the same time likewise to a lower measurement speed.

The predefined measurement criterion may be determined based on at least one of a signal level of the RF signal and a rotary angle of an antenna (not shown) of the measurement device 100.

Furthermore, the predefined measurement criterion can be adjusted depending on each condition of measurement. The SNR should be higher if the signal level is higher. On the other hand, the SNR should be lower if the backside of the antenna of the side lobes of the antenna are measured, in case the antenna is DUT.

Basically, the controller 110 is configured to adjust the IFBW to be reduced when the calculated SNR value does not meet the predefined measurement criterion. The controller 110 is configured to adjust the number of samples to be increased when the calculated SNR value does not meet the measurement criterion. For example, if the calculated SNR is below the range or a specific SNR value, the controller 110 is configured to adjust at least one of IFBW and the number of samples of the detector 108.

On the other hand, the controller 110 may be configured to control at least one of the IFBW and the number of samples in accordance with the calculated SNR such to control a measurement speed.

If the calculated SNR value stays within a certain predetermined SNR range or at a certain predetermined SNR value, the controller 110 does not need to further adjust the parameters, e.g. IFBW and number of samples of detector 108, that control the SNR value.

As described above, the controller 100 may control the detection time of the detector 108 to adjust the number of samples. For example, the controller 110 is configured to increase the detection time to increase or at least to improve the SNR value.

More specifically, if the calculated SNR is below the predetermined range or below the predetermined value, the controller 110 is configured to:
a) reduce the IFBW; and/or
b) increase the average count (number of samples).

If the calculated SNR is above the predetermined range or above the predetermined value, the controller 110 is configured to:
c) increase the IFBW; and/or
d) decrease the average count.

The controller 110 may be configured to adjust at least one of the IFBW and the number of samples repeatedly until either the calculated SNR meets a predefined measurement criterion or a predefined timer is expired.

The controller 110 is also configured to adjust a local oscillator (LO) signal which is provided to the mixer 112, so that the respective frequency step can be achieved.

The same way, the controller 110 is also configured to adjust the control signal to set a frequency of the numerically controlled oscillator (NCO) 126.

Further, the controller 110 is also configured to adjust the IFBW signal.

Preferably, at least one of the average detector 116 and the RMS detector 114 are controlled by the controller 110.

The measurement device 100 may further include a user interface 118. The user interface 118 is configured to display, amongst others, the calculated SNR value X6 to a user. In this manner, the user may recognize easily and instinctively the quality of the analysis result of the measurement.

The user interface 118 may further display the result of analysis together with the calculated SNR values X6. The user interface 118 may display two separate diagrams illustrating separately the analysis result and the calculated SNR value X6, respectively. The analysis result and the calculated SNR value X6 are preferably displayed via the user interface 118 at the same time.

Alternatively, the user interface 118 may display tabs to choose one of the diagrams depending on the user's preference.

The user interface 118 may be further configured to receive a user-specific measurement criterion from the user.

Furthermore, the user interface 118 may be further configured to receive a request from the user to maintain the SNR value that meets the measurement criterion to be constant. In this case, the controller 110 controls both the IFBW and the number of samples of detector 108 to maintain the SNR value as constant as possible.

The user interface 118 may be further configured to receive a configuration of spacing between adjacent frequency steps.

The user interface 118 may be part of the measurement device 100. However, it is also possible that the user interface 118 is a separate device different from the measurement device 100 but coupled to the measurement device 100, so that the user may access the measurement device 100 remotely, for example via a web browser.

In a preferred embodiment, the user interface 118 can be displayed on a display of the measurement device 100. The display can be a touch screen that is configured to receive a user input. However, the measurement device 100 could also be configured to remotely display the user interface, for example by running a web browser which the user can access.

The measurement device 110 may further include a first analog mixer 112. The first analog mixer 112 is arranged between the input terminal 102 and the at least one A/D converter 104. The LO signal is fed to the first analog mixer 112. The controller 110 is configured to subsequently change the frequency of the LO signal during the sweep by the filter 106 in the form of a frequency sweep. More specifically, for each frequency step, a different LO signal is applied.

According to an embodiment, the sweep procedure comprises a plurality of steps. Preferably, the controller 110 is configured to calculate the SNR for each frequency step. The controller 110 is configured to adjust:
a) the IFBW of the at least one filter 106 during that step; and/or
b) the average count of the detector 108 during that step, until the calculated SNR meets the predetermined criterion (for example: frequency sweep starts with frequency 9 kHz, and stops at frequency 67 GHz, step: frequency step, power step, time step).

The measurement device 100 may further include the signal generator 120 configured to generate the excitation signal X0. In the example shown in FIG. 2, the signal generator 120 is included in the measurement device 110. However, additionally or alternatively, the signal generator 120 may also be an external device. The controller 110 of the measurement device 100 is preferably configured to control the signal generator 120.

The controller 110 is also configured to adjust the LO signal, so that the respective frequency step can be achieved. The same is true for the NCO and IFBW signal. The average detector 116 and/or the RMS detector 114 are also controlled by the controller 110.

The controller 110 may be any kind of programmable unit, such as a microprocessor, microcomputer, programmable logic unit (such as an FPGA or PLD), etc.

According to the present disclosure, the user may recognize the quality of the measurement result more easily and instinctively. In addition, according to the user's preference and/or user-specific configuration the SNR can be maintained as a result of the analysis described above, and therefore the quality of the measurement can be efficiently improved or at least guaranteed.

FIG. 3 is an example of a continuous-wave (CW) signal, IFBW and noise distribution for a specific frequency step according to an aspect.

In FIG. 3, a frequency step is shown at 1 GHz. The continuous wave (CW) signal is to be measured. However, it is not possible to control the bandwidth of CW signal.

The IFBW is always centered around the frequency of the respective frequency step. If the IFBW is 100 kHz, then the IFBW rectangle is arranged between −50 kHz and +50 kHz around 1 GHz. If the IFBW becomes smaller, less noise is added.

In terms of controlling the IFBW, the wider the bandwidth (i.e. size of the rectangle) is, the faster is the measurement. For example, the IFBW may be 100 kHz. However, in this description, the width of IFBW is not limited to a specific value.

FIGS. 3A and 3B are examples describing how the measurement device 10 operates.

FIG. 3A shows an example of different SNR curves. Line (a) represents the frequency-dependent SNR curve for a commonly known measurement device, and line (b) represents the corresponding SNR curve for a measurement device according to the present disclosure. For comparably lower frequencies, the SNR curve represented by line (a) is better than for higher frequencies. However, referring to line (b), the SNR curve re-mains at a constant level more or less for all frequencies. Therefore, it is possible to guarantee the constant quality of the measurement, and the user may recognize this quality easily by representing its SNR value.

FIG. 3B shows an example of different IFBW curves. Line (c) represents the frequency-dependent IFBW curve for a commonly known measurement device, and line (d) represents the corresponding IFBW curve for a measurement device according to the present disclosure. If the IFBW is not maintained constant, as it is used in commonly known measurement devices (see line c)), but is dynamically controlled (see line d)) according to aspects of this invention, then basically the same constant SNR value as represented by line (b) can be achieved. FIG. 4 is a flow chart illustrating a method 400 of operating a measurement device 100 for testing a device under test 200 according to the further aspects. The method comprises at least the steps S402, S404, S406, S408, S410, S412.

In step S402, an input terminal 102 receives a RF signal from a DUT 200 that is connected or coupled to the input terminal 102.

In step S404, at least one analog-to-digital (A/D) converter 104 generates a digital data stream including a plurality of samples from the received RF signal.

In step S406, at least one filter 106 filters the digital data stream generated by the at least one A/D converter 104 based on an intermediate-frequency bandwidth (IFBW) set in the at least one filter 106.

In step S408, a detector 108 analyses the filtered digital data stream based on a pre-set number of samples from the filtered digital data stream.

In step S410, a controller 110 calculates a signal-to-noise ratio (SNR) value of the analysed filtered digital data stream.

In step S412, the controller 110 adjusts at least one of the IFBW of the at least one filter 106 and the number of samples of the detector 108 based on the calculated SNR value.

The controller 110 is configured to adjust at least one of the IFBW and the number of samples used in the detector 108 in accordance with the calculated SNR such that the calculated SNR meets or approaches a predefined SNR value or lies within a predefined SNR range.

The controller 110 is configured to adjust the IFBW to be reduced when the calculated SNR value does not meet the measurement criterion. The controller 110 is configured to adjust the number of samples used in the detector 108 to be increased when the calculated SNR value does not meet the measurement criterion. Or in other words: The adjustment happens in both directions: If the measured SNR is above a desired or predefined SNR, then the IFBW is increased or the numbers of samples for calculating the RMS and/or average values are reduced. On the other hand, if the measured SNR is below a desired or predefined SNR, then the IFBW is reduced or the numbers of samples for calculating the RMS and/or average values are increased.

The controller 110 is configured to control at least one of the IFBW and the number of samples in accordance with the calculated SNR such to control a measurement speed.

The measurement device 100 further comprises a user interface 118 configured to display the calculated SNR value to a user. The user interface 118 is configured to display the calculated SNR value together with the result of analysis at the same time. The user interface 118 is configured to receive a user-specific measurement criterion from the user. The user interface 118 may also be configured to receive a request from the user to maintain the SNR value that meets the measurement criterion to be constant.

The filter 106 is configured to sweep at least one of a plurality of frequency steps. The controller 110 is configured to calculate the SNR value for each of the plurality of frequency steps.

The plurality of frequency steps is preferably spaced apart from each other. The controller 110 may be configured to adjust each spacing between adjacent frequency steps. The spacing between adjacent frequency steps may also be set by a user via the user interface 118.

The measurement device 100 further comprises an analog mixer 112 arranged between the input terminal 102 and the at least one A/D converter 104.

The controller 110 is configured to adjust at least one of the IFBW and the number of samples repeatedly and preferably until either the calculated SNR meets a measurement criterion or a predefined timer is expired.

The detector 108 preferably includes at least one root mean square (RMS) detector 114 providing an average signal power of signal as opposed to a peak of the signal and/or an average detector 116 providing an average amplitude of the signal across a specific period.

The measurement criterion is determined based on at least one of a signal level of the RF signal and a rotary angle of an antenna of the measurement device 100.

The measurement device 100 is a vector network analyzer (VNA), a spectrum analyzer, a signal analyzer, or a communication analyzer.

Although the present invention has been described in the above by way of preferred embodiments, it is not limited thereto, but rather can be modified in a wide range of ways. In particular, the invention can be changed or modified in various ways without deviating from the core of the invention.

LIST OF REFERENCE SIGNS 100 measurement device
102 input terminal
104 A/D converter
106 filter
108 detector
110 controller 112 (analog) mixer
114 RMS detector
116 average detector
118 user interface
120 signal generator
122 (digital) mixer
124 output terminal
126 oscillator, numerically controlled oscillator, NCO
200 DUT
S400 method
S402-S412 steps
X0-X6 signals

What we claim is:

1. A measurement device for testing a device under test (DUT), the measurement device comprising:
   an input terminal for receiving a RF signal from the DUT;
   at least one analog-to-digital (A/D) converter configured to generate a digital data signal including a plurality of samples of the received RF signal;
   at least one filter configured to filter the digital data signal generated by the at least one A/D converter based on an intermediate-frequency bandwidth (IFBW) set in the at least one filter;
   a detector configured to analyse the filtered digital data signal based on a pre-set number of samples from the filtered digital data signal; and
   a controller configured to calculate a signal-to-noise ratio (SNR) value of the analysed filtered digital data signal, and further configured to adjust at least one of:
   a) the IFBW of the at least one filter and
   b) the number of samples of the detector based on the calculated SNR value,
      wherein the controller is configured to control at least one of the IFBW and the number of samples in accordance with the calculated SNR such to meet a predetermined measurement criterion.

2. The measurement device of claim 1, wherein the predetermined measurement criterion is defined by one of:
   a predetermined SNR value,
   a plurality of specific SNR values and
   a predetermined SNR range.

3. The measurement device of claim 2, wherein the controller is configured to:
   reduce the IFBW; and/or
   increase the number of samples,
   in case the calculated SNR value is below the predetermined SNR range or below the predetermined SNR value.

4. The measurement device of claim 2, wherein the controller is configured to:
   increase the IFBW; and/or
   decrease the number of samples,
   in case the calculated SNR value is above the predetermined SNR range or above the predetermined SNR value.

5. The measurement device of claim 1, wherein the controller is configured to adjust the IFBW to be reduced when the calculated SNR value does not meet the predetermined measurement criterion.

6. The measurement device of claim 1, wherein the controller is configured to adjust the number of samples to be increased when the calculated SNR value does not meet the predetermined measurement criterion.

7. The measurement device of claim 1, wherein the controller is configured to control at least one of the IFBW and the number of samples in accordance with the calculated SNR such to adjust a measurement speed.

8. The measurement device of claim 1, further comprising a user interface configured to display the calculated SNR value.

9. The measurement device of claim 8, wherein the user interface is configured to display the calculated SNR value together with the result of the analysis.

10. The measurement device of claim 8, wherein the user interface is configured to receive a user-specific measurement criterion.

11. The measurement device of claim 10, wherein the user interface is configured to receive a user request to maintain the SNR value that meets the measurement criterion to be constant.

12. The measurement device of claim 1, wherein the filter is configured to sweep at least one of a plurality of frequency steps, and the controller is configured to calculate the SNR value for each of the plurality of frequency steps.

13. The measurement device of claim 12, wherein the plurality of frequency steps is spaced apart from each other, and wherein the controller is configured to adjust each spacing between adjacent frequency steps.

14. The measurement device of claim 13, wherein the spacing between adjacent frequency steps is set via a user interface.

15. The measurement device of claim 1, further comprising an analog mixer arranged between the input terminal and the at least one A/D converter wherein a local oscillator signal is fed to the analog mixer.

16. The measurement device of claim 15, wherein the controller is configured to subsequently change or adjust the frequency of the local oscillator signal during a sweep in the form of a frequency sweep.

17. The measurement device of claim 1, wherein the controller is configured to change or adjust at least one of the IFBW and the number of samples repeatedly until either the calculated SNR meets a measurement criterion or a predefined timer is expired.

18. The measurement device of claim 1, wherein the detector includes at least one of:
    a root mean square (RMS) detector and
    an average detector,
    wherein the controller is configured to calculate the SNR based on the result provided by the RMS detector and the average detector, respectively.

19. The measurement device of claim 1, wherein the measurement criterion is determined based on at least one of:
    a signal level of the RF signal and
    a rotary angle of an antenna of the measurement device.

20. The measurement device of claim 1, further comprising a signal generator and an output terminal wherein the signal generator is configured to generate an excitation signal which is provided via the output terminal to a DUT.

21. The measurement device of claim 1, wherein the measurement device comprises at least one of:
    a vector network analyzer (VNA),
    a spectrum analyzer,
    a signal analyzer,
    a communication analyzer.

22. A method for operating a measurement device for testing a device under test (DUT), the method comprising:
    receiving, by an input terminal, a RF signal from the DUT;
    generating, by at least one analog-to-digital (A/D) converter, a digital data signal including a plurality of samples of the received RF signal;

filtering, by at least one filter, the digital data signal generated by the at least one A/D converter based on an intermediate-frequency bandwidth (IFBW) set in the at least one filter;

analysing, by a detector, the filtered digital data signal based on a pre-set number of samples from the filtered digital data signal;

calculating, by a controller, a signal-to-noise ratio (SNR) value of the analysed filtered digital data signal; and adjusting, by the controller, at least one of:
   a) the IFBW of the at least one filter and
   b) the number of samples of the detector based on the calculated SNR value,
      wherein the controller is configured to control at least one of the IFBW and the number of samples in accordance with the calculated SNR such to meet a predetermined measurement criterion.

23. A non-transitory computer-readable recording medium, storing instructions executable by a computer processor, causing the computer processor to execute a method of operating a measurement device for testing device under test, the instructions comprising:

receiving, by an input terminal, a RF signal from the DUT;

generating, by at least one analog-to-digital (A/D) converter, a digital data including a plurality of samples of the received RF signal;

filtering, by at least one filter, the digital data signal generated by the at least one A/D converter based on an intermediate-frequency bandwidth (IFBW) set in the at least one filter;

analysing, by a detector, the filtered digital data signal based on a pre-set number of samples from the filtered digital data signal;

calculating, by a controller, a signal-to-noise ratio (SNR) value of the analysed filtered digital data signal; and adjusting, by the controller, at least one of:
   a) the IFBW of the at least one filter and
   b) the number of samples of the detector based on the calculated SNR value,
      wherein the controller is configured to control at least one of the IFBW and the number of samples in accordance with the calculated SNR such to meet a predetermined measurement criterion.

* * * * *